(12) United States Patent
Kim et al.

(10) Patent No.: US 8,450,732 B2
(45) Date of Patent: May 28, 2013

(54) OXIDE SEMICONDUCTORS AND THIN FILM TRANSISTORS COMPRISING THE SAME

(75) Inventors: Chang-jung Kim, Yongin-si (KR); Sang-wook Kim, Yongin-si (KR); Sun-il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 368 days.

(21) Appl. No.: 12/213,402

(22) Filed: Jun. 19, 2008

(65) Prior Publication Data

US 2008/0315194 A1  Dec. 25, 2008

(30) Foreign Application Priority Data

Jun. 19, 2007 (KR) .................. 10-2007-0060053
May 30, 2008 (KR) .................. 10-2008-0050994

(51) Int. Cl.
- *H01L 29/12* (2006.01)
- *H01B 1/02* (2006.01)
- *C04B 35/46* (2006.01)
- *C04B 35/48* (2006.01)
- *C04B 35/49* (2006.01)

(52) U.S. Cl.
USPC ....... 257/43; 257/E29.296; 252/512; 501/137

(58) Field of Classification Search
USPC .............. 257/43, E29.296; 252/512; 501/137
See application file for complete search history.

(56) References Cited

U.S. PATENT DOCUMENTS

| | | | |
|---|---|---|---|
| 4,960,718 A | 10/1990 | Aina | |
| 5,337,274 A | 8/1994 | Ohji | |
| 5,656,824 A | 8/1997 | den Boer et al. | |
| 5,854,139 A | 12/1998 | Aratani et al. | |
| 5,972,527 A | 10/1999 | Kaijou et al. | |
| 6,107,734 A | 8/2000 | Tanaka et al. | |
| 6,458,636 B1 | 10/2002 | Yi et al. | |
| 6,552,387 B1 | 4/2003 | Eitan | |
| 6,562,491 B1 | 5/2003 | Jeon | |
| 6,563,174 B2 | 5/2003 | Kawasaki et al. | |
| 6,727,522 B1 | 4/2004 | Kawasaki et al. | |
| 6,727,533 B2 | 4/2004 | Matsuzaki et al. | |
| 6,878,962 B1 | 4/2005 | Kawasaki et al. | |
| 6,882,012 B2 | 4/2005 | Yamazaki et al. | |
| 6,929,970 B2 | 8/2005 | Andriessen et al. | |

(Continued)

FOREIGN PATENT DOCUMENTS

CN 1348192 5/2002
EP 1 737 044 A1 12/2006

(Continued)

OTHER PUBLICATIONS

International Search Report dated Dec. 19, 2008 for corresponding International Application No. PCT/KR2008/003471.

(Continued)

*Primary Examiner* — David S Blum
(74) *Attorney, Agent, or Firm* — Harness, Dickey & Pierce, P.L.C.

(57) ABSTRACT

Oxide semiconductors and thin film transistors (TFTs) including the same are provided. An oxide semiconductor includes Zn atoms and at least one of Ta and Y atoms added thereto. A thin film transistor (TFT) includes a channel including an oxide semiconductor including Zn atoms and at least one of Ta and Y atoms added thereto.

24 Claims, 17 Drawing Sheets

U.S. PATENT DOCUMENTS

| | | | |
|---|---|---|---|
| 7,061,014 | B2 | 6/2006 | Hosono et al. |
| 7,067,843 | B2 | 6/2006 | Carcia et al. |
| 7,071,122 | B2 | 7/2006 | Saenger et al. |
| 7,145,174 | B2 | 12/2006 | Chiang et al. |
| 7,188,922 | B2 | 3/2007 | Kubo |
| 7,189,992 | B2 | 3/2007 | Wager, III et al. |
| 7,220,635 | B2 | 5/2007 | Brask et al. |
| 7,285,501 | B2 * | 10/2007 | Mardilovich et al. ......... 438/763 |
| 7,411,209 | B2 | 8/2008 | Endo et al. |
| 7,456,468 | B2 | 11/2008 | Jeon et al. |
| 8,299,461 | B2 | 10/2012 | Tanaka et al. |
| 2001/0000756 | A1 | 5/2001 | Batra et al. |
| 2002/0074657 | A1 | 6/2002 | Nakayama et al. |
| 2002/0146624 | A1 | 10/2002 | Goto et al. |
| 2003/0218221 | A1 | 11/2003 | Wager, III et al. |
| 2004/0038446 | A1 | 2/2004 | Takeda et al. |
| 2004/0069990 | A1 | 4/2004 | Mahajani et al. |
| 2004/0127038 | A1 | 7/2004 | Carcia et al. |
| 2004/0155270 | A1 | 8/2004 | Hoffman |
| 2004/0180217 | A1 | 9/2004 | Inoue et al. |
| 2005/0017244 | A1 | 1/2005 | Hoffman et al. |
| 2005/0017302 | A1 | 1/2005 | Hoffman |
| 2005/0039670 | A1 | 2/2005 | Hosono et al. |
| 2005/0062134 | A1 | 3/2005 | Ho et al. |
| 2005/0167668 | A1 | 8/2005 | Korenari et al. |
| 2005/0199959 | A1 | 9/2005 | Chiang et al. |
| 2005/0199960 | A1 | 9/2005 | Hoffman et al. |
| 2005/0258474 | A1 | 11/2005 | Tanaka et al. |
| 2005/0275038 | A1 | 12/2005 | Shih et al. |
| 2006/0003485 | A1 | 1/2006 | Hoffman et al. |
| 2006/0038242 | A1 | 2/2006 | Hsu et al. |
| 2006/0068091 | A1 | 3/2006 | Denda |
| 2006/0079034 | A1 | 4/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0214008 | A1 | 9/2006 | Asami et al. |
| 2006/0220023 | A1 * | 10/2006 | Hoffman et al. ................ 257/72 |
| 2006/0244107 | A1 | 11/2006 | Sugihara et al. |
| 2006/0284172 | A1 | 12/2006 | Ishii |
| 2006/0286737 | A1 | 12/2006 | Levy et al. |
| 2006/0292777 | A1 | 12/2006 | Dunbar |
| 2007/0007538 | A1 * | 1/2007 | Ono et al. ........................ 257/79 |
| 2007/0023750 | A1 | 2/2007 | Chiang et al. |
| 2007/0072439 | A1 | 3/2007 | Akimoto et al. |
| 2007/0184576 | A1 | 8/2007 | Chang et al. |
| 2007/0187760 | A1 | 8/2007 | Furuta et al. |
| 2007/0194379 | A1 * | 8/2007 | Hosono et al. ................ 257/347 |
| 2007/0254399 | A1 | 11/2007 | Wang et al. |
| 2008/0067508 | A1 | 3/2008 | Endo et al. |
| 2008/0197414 | A1 * | 8/2008 | Hoffman et al. .............. 257/347 |
| 2008/0206923 | A1 | 8/2008 | Kim et al. |
| 2008/0315194 | A1 | 12/2008 | Kim et al. |
| 2008/0315200 | A1 | 12/2008 | Kim et al. |

FOREIGN PATENT DOCUMENTS

| | | |
|---|---|---|
| EP | 1737044 | 12/2006 |
| JP | 63-265818 | 11/1988 |
| JP | 10-306367 | 11/1998 |
| JP | 2003-017749 | 1/2003 |
| JP | A-2004-356196 | 12/2004 |
| JP | A-2005-026465 | 1/2005 |
| JP | 2005-033172 | 2/2005 |
| JP | 2005-093974 | 4/2005 |
| JP | 2006-005116 | 1/2006 |
| JP | 2007-073312 | 3/2007 |
| JP | 2007-529119 | 10/2007 |
| KR | 1995-0002052 | 4/1995 |
| KR | 10-2000-0074893 | 12/2000 |
| KR | 10-2002-0028430 | 4/2002 |
| KR | 10-2002-0066574 | 8/2002 |
| KR | 10-2002-0088488 | 11/2002 |
| KR | 10-2005-0092712 | 9/2005 |
| KR | 10-2005-0123332 | 12/2005 |
| KR | 10-2006-0114469 | 11/2006 |
| KR | 10-2006-0123765 | 12/2006 |
| KR | 10-2007-0090182 | 9/2007 |
| KR | 10-2007-0116888 | 12/2007 |
| KR | 10-0811997 | 3/2008 |
| WO | WO 2005/074038 A1 | 8/2005 |
| WO | WO 2005/088726 | 9/2005 |
| WO | WO 2007/119386 | 10/2007 |
| WO | WO 2007/040194 | 6/2008 |

OTHER PUBLICATIONS

Office Action mailed May 11, 2010 for co-pending U.S. Appl. No. 11/978,581.
Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Aug. 20, 2009 for co-pending U.S. Appl. No. 11/785,269.
Office Action mailed Apr. 2, 2010 for co-pending U.S. Appl. No. 12/213,327.
Office Action mailed May 21, 2010 for co-pending U.S. Appl. No. 11/785,269.
International Search Report dated May 21, 2008.
European Search Report dated Aug. 28, 2009.
Chinese Office Action mailed Oct. 25, 2010 and English translation thereof.
Office Action dated Nov. 24, 2010 for U.S. Appl. No. 11/978,581.
Office Action dated Dec. 3, 2010 for U.S. Appl. No. 12/071,097.
Supplemental Notice of Allowance for corresponding U.S. Appl. No. 11/785,269 dated Dec. 27, 2010.
Office Action for U.S. Appl. No. 12/453,530.
Chinese Office Action mailed Aug. 23, 2010 and English translation thereof.
European Search Report and Written Opinion dated Jun. 16, 2010.
European Search Report and Written Opinion dated Jun. 14, 2010.
Office Action mailed Sep. 15, 2009 for co-pending U.S. Appl. No. 12/213,327.
Office Action mailed Nov. 16, 2009 for co-pending U.S. Appl. No. 12/213,399.
International Search Report dated Sep. 25, 2008 for corresponding International Application No. PCT/KR2008/003470.
Chinese Office Action mailed Aug. 4, 2010 and English translation thereof.
Office Action issued by the European Patent Office dated May 10, 2011 for EP Application No. 09 160 223.5-1528.
U.S. Office Action dated Jul. 7, 2011, issued in co-pending U.S. Appl. No. 12/453,530.
The MOSFET—Introduction, MOS Field Effect Transistors, B.J. Van Zeghbroeck, Web book "Principles of Semiconductor Devices", Boulder, Dec. 2004, Chapter 7.
U.S. Office Action dated Jun. 27, 2011, issued in co-pending U.S. Appl. No. 12/071,097.
U.S. Office Action dated Oct. 6, 2011, issued in co-pending U.S. Appl. No. 11/978,581.
U.S. Office Action dated Nov. 23, 2011, issued in co-pending U.S. Appl. No. 12/071,097.
Japanese Office Action dated Jan. 1, 2012 issued in Japanese Application No. 2009-506414.
European Search Report dated Jan. 23, 2012 issued in European Application No. 11183826.4.
European Exam Report dated Jan. 23, 2012 issued in European Application No. 09160223.5.
U.S. Office Action dated Mar. 22, 2012 issued in U.S. Appl. No. 12/929,324.
U.S. Office Action dated Apr. 6, 2012 issued in U.S. Appl. No. 11/978,581.
U.S. Office Action dated Apr. 13, 2012 issued in U.S. Appl. No. 12/929,323.

US Office Action dated Jul. 17, 2012 issued in U.S. Appl. No. 12/929,324.

Office Action for U.S. Appl. No. 12/453,530, Jan. 13, 2011.

Carcia, P.F. et al. "Transparent ZnO thin-film transistor fabricated by rf magnetron sputtering," *Applied Physics Letters*, vol. 82, No. 7 (Feb. 17, 2003): pp. 1117-1119.

Nomura, Kenji et al. "Room-temperature fabrication of transparent flexible thin-film transistors using amorphous oxide semiconductors," *Nature*, vol. 432 (Nov. 25, 2004): pp. 488-492.

International Search Report and Written Opinion dated Jul. 25, 2007 issued in International Application No. PCT/KR2007/001875.

Chinese Office Action dated Aug. 23, 2012, issued in Application No. 200910140975.3 and English translation thereof.

Notice of Allowance dated Dec. 7, 2012 and issued in U.S. Appl. No. 12/929,324.

Japanese Office Action issued in Application No. 2010-513115 dated Nov. 20, 2012 and English translation thereof.

* cited by examiner

OXIDE SEMICONDUCTORS AND THIN FILM TRANSISTORS COMPRISING THE SAME

PRIORITY STATEMENT

This non-provisional patent application claims priority under 35 U.S.C. §119 to Korean Patent Application Nos. 10-2007-0060053, filed on Jun. 19, 2007 and 10-2008-0050994, filed on May 30, 2008, in the Korean Intellectual Property Office, the entire contents of each of which are incorporated herein by reference.

BACKGROUND

Description of the Related Art

Conventional thin film transistors (TFTs) are utilized in various fields of application. For example, TFTs are used as switching and driving devices in display devices and as selective switches of cross-point type memory devices.

While liquid crystal displays (LCDs) have been widely used as display panels for televisions (TVs), organic light emitting displays (OLEDs) may also be used. TV display technology is being developed according to market demands. These market demands include larger-sized TVs or digital information displays (DIDs), reduced costs, higher-quality images (e.g., better dynamic image presentation, higher definition, higher luminosity, better contrast ratio and color reproduction, etc.). To satisfy these requirements, in addition to fabrication of larger-sized substrates (e.g., glass), relatively high-performance TFTs suitable for being used as switching and driving devices for displays may be necessary.

Conventionally, amorphous silicon TFTs (a-Si TFTs) are used as driving and switching devices for displays. Conventional a-Si TFTs are devices that may be relatively uniformly formed on substrates greater than about 4 m$^2$ in area at relatively low costs. These types of TFTs are widely used as driving and switching devices. To satisfy recent trends towards larger-sized and higher image quality displays, TFTs with improved performance may be necessary. But, conventional a-Si TFTs with mobility of about 0.5 cm$^2$/Vs may have reached the limit of their application. In this regard, higher-performance TFTs with higher mobility than conventional a-Si TFTs and technologies for fabricating such higher-performance TFTs may be necessary.

Polycrystalline silicon TFTs (poly-Si TFTs) having better performance than a-Si TFTs have relatively high mobility, for example, several tens to several hundreds of cm$^2$/Vs. These conventional poly-Si TFTs may be applied to displays to provide relatively high image quality, which may not be realized by conventional a-Si TFTs. Moreover, the characteristics of poly-Si TFTs degrade less than a-Si TFTs. However, processes for manufacturing poly-Si TFTs are more complicated than processes for manufacturing a-Si TFTs. The more complex processes result in additional costs. In short, poly-Si TFTs are suitable for manufacturing displays with relatively high image quality and may be applied to products such as OLEDs, but are less cost-effective than a-Si TFTs. Consequently, poly-Si TFTs are applied restrictively. In addition, due to technological problems such as limits on the manufacturing equipment or lack of uniformity of conventional poly-Si TFTs, the formation of poly-Si TFTs on substrates greater than about 1 m$^2$ in area has not been realized. Consequently, applying conventional poly-Si TFTs to larger-sized TV products is relatively difficult.

Oxide semiconductor devices are another conventional TFT technology. Oxide semiconductors may include ZnO-based TFTs. Conventional ZnO-based materials include Zn oxides, In—Zn oxides, Zn oxides doped with Ga, Mg, Al, Fe, or the like, In—Zn oxides doped with, Ga, Mg, Al, Fe, or the like, etc. ZnO-based semiconductor devices may be manufactured from an amorphous ZnO-based semiconductor using a relatively low-temperature process, which enables easier manufacture of ZnO-based semiconductor devices on larger-sized substrates. A ZnO-based semiconductor, which is a material with relatively high mobility, has electrical properties similar to polycrystalline silicon.

SUMMARY

Example embodiments relate to oxide semiconductors, thin film transistors (TFTs) including the same and methods of manufacturing the same; for example, oxide semiconductors including a Zinc (Zn) oxide to which an additional material (e.g., Ta and/or Y) is added and TFTs including the same. Example embodiments also provide oxide TFTs having a channel region including the oxide semiconductor.

According to at least one example embodiment, an oxide semiconductor may include Zn atoms and at least one of Ta and Y atoms added thereto. A thin film transistor (TFT) may include a channel including an oxide semiconductor. The oxide semiconductor may include Zn atoms and at least one of Ta and Y atoms added thereto.

At least one example embodiment provides an oxide semiconductor comprising Zn and Tantalum (Ta).

At least one other example embodiment provides an oxide TFT. The oxide TFT may include a gate and a channel formed to correspond to the gate. The channel may include an oxide semiconductor including Zn and Ta. A gate insulator may be formed between the gate and the channel. A source and a drain may contact respective sides of the channel.

According to at least some example embodiments, the oxide semiconductor may include a Zn oxide including Ta. Alternatively, the oxide semiconductor may include a Zn—In composite oxide including Ta. The oxide semiconductor may have an at % ratio of Ta:In:Zn in the range of about 1:2.1 to 18:1.6 to 14, inclusive. For example, the oxide semiconductor may have an at % ratio of Ta:In:Zn in the range of about 1:2.1 to 9.5:1.6 to 6.4, inclusive. In yet another example, the oxide semiconductor may have an at % ratio of Ta:In:Zn in the range of about 1:5.7 to 9.5:4.8 to 6.4, inclusive. The oxide semiconductor may further include an element selected from the group consisting of or including elements of Groups I, II, III, IV, and V and elements belonging to the lanthanide series.

At least one other example embodiment provides an oxide semiconductor comprising Zn and Yttrium (Y).

At least one other example embodiment provides an oxide TFT. The oxide TFT may include a gate and a channel formed to correspond to the gate. The channel may include an oxide semiconductor including Zn and Y. A gate insulator may be formed between the gate and the channel. A source and a drain may contact respective sides of the channel.

According to at least some example embodiments, the oxide semiconductor may include a Zn oxide including Y. Alternatively, the oxide semiconductor may include a Zn—In composite oxide including Y. The oxide semiconductor may have an at % ratio of Y:In:Zn in the range of about 1:10 to 100:10 to 80, inclusive. For example, the oxide semiconductor may have an at % ratio of Y:In:Zn in the range of about 1:21.7 to 50:14 to 41, inclusive. In yet another example, the oxide semiconductor may have an at % ratio of Y:In:Zn in the range of about 1:46 to 50:30 to 41, inclusive. The oxide semiconductor may further include one element selected from the group consisting of elements of Groups I, II, III, IV, and V and elements belonging to the lanthanide series.

At least one other example embodiment provides an oxide semiconductor comprising Zn and at least one of Ta and Y.

At least one other example embodiment provides an oxide TFT. The oxide TFT may include a gate and a channel formed to correspond to the gate. The channel may include an oxide semiconductor including Zn and at least one of Ta and Y. A gate insulator may be formed between the gate and the channel. A source and a drain may contact respective sides of the channel. The oxide semiconductor may include a Zn oxide or a Zn—In composite oxide.

At least one other example embodiment provides a method of manufacturing an oxide semiconductor. According to at least this example embodiment, the method may include forming an oxide semiconductor including Zn and at least one of Ta and Y.

At least one other example embodiment provides a method of manufacturing an oxide thin film transistor. According to at least this example embodiment, a gate may be formed on a substrate. A gate insulating layer may be formed on the gate. A channel region may be formed on the insulating layer. The channel region may include an oxide semiconductor including Zn and at least one of Ta and Y. Source and drain regions may be formed on respective ends of the channel region.

BRIEF DESCRIPTION OF THE DRAWINGS

Example embodiments will become more apparent by describing in detail the example embodiments shown in the attached drawings in which.

DETAILED DESCRIPTION OF EXAMPLE EMBODIMENTS

Figure 1A:
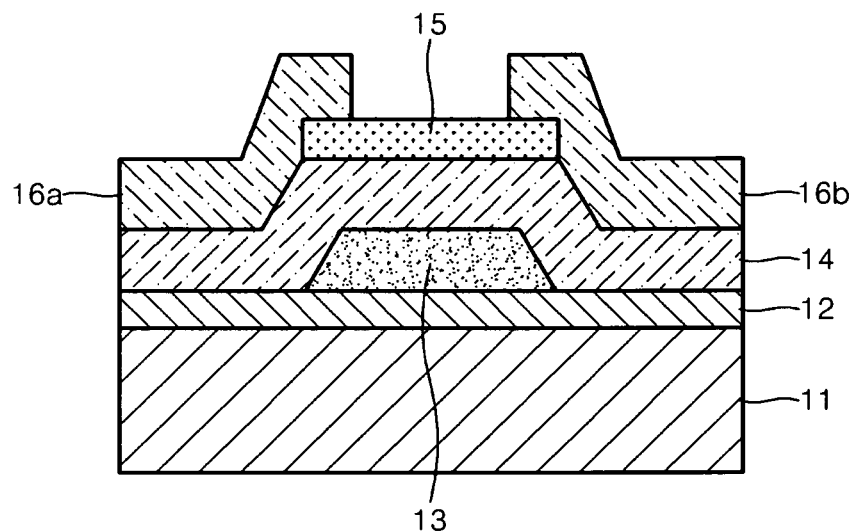
FIGS. 1A and 1B show cross-sectional views of thin film transistors including oxide semiconductors according to example embodiments.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

An oxide semiconductor and an oxide thin film transistor (TFT) including the same according to example embodiments will now be described more fully with reference to the accompanying drawings. For reference, the thicknesses and widths of layers shown in the drawings are exaggerated for the purpose of understanding.

An oxide semiconductor according to an example embodiment may include a Zn oxide or a Zn—In composite oxide to which Tantalum (Ta) or Yttrium (Y) is added.

Ta having electronegativity of about 1.5 and Y having electronegativity of about 1.2 may form a relatively strong ionic bond with oxygen (O) having electronegativity of about 3.5 since an electronegativity difference between Ta and O and between Y and O is about 2.0 and 2.3, respectively. Ta has an ionic radius of about 0.070 nm and Y has an ionic radius of about 0.093 nm, which are similar to that of Zn, which has an ionic radius of about 0.074 nm. Thus, if Ta and/or Y is added to a Zn oxide or a Zn—In composite oxide, Ta and/or Y may be more easily substituted for Zn with little or no deformation of crystal lattice of the oxides.

With respect to a-Si:H, for example, a covalent bond may be formed between a-Si and H. When a-Si:H is coordinated with sp3 oxygen having directionality to form an amorphous phase, an electron cloud around oxygen bonds may be distorted, which may result in formation of relatively weak bonds. When TFTs having such a weak bonding structure are operated for relatively long periods of time, electrons or holes may accumulate at bonding sites. This may cause bonding states to break. Breaking of bonding sites may adversely affect reliability due to a threshold voltage shift.

On the other hand, with respect to an ionic bond, electron orbitals may overlap regardless of binding of oxygen an-ions due to a relatively large electron cloud of cat-ions. Thus, the resultant bonding structure may have little or no relatively weak bonds irrespective of whether it is a crystal phase or a non-crystal (e.g., amorphous) phase. This may enable manufacturing of a more reliable TFT. The Zn oxide or the Zn—In composite oxide including Ta and/or Y may be mainly formed of ionic groups, but all of the bindings need not be ionic bonds.

In an example embodiment of an oxide semiconductor including an In—Zn composite oxide including Ta, an at % ratio of Ta:In:Zn may be in the range of about 1:2.1 to 18:1.6 to 14, inclusive. In an example embodiment of an oxide semiconductor including an In—Zn composite oxide including Y, an at % ratio of Y:In:Zn may be in the range of about 1:10 to 100:10 to 80, inclusive.

Oxide semiconductors according to example embodiments may further include elements of Group I such as Li and K, elements of Group II such as Mg, Ca, and Sr, elements of Group III such as Ga, Al, In, and Y, elements of Group IV such as Ti, Zr, Si, Sn, and Ge, elements of Group V such as Ta, Vb, Nb, and Sb, elements belonging to the lanthanide series such as La, Ce, Pr, Nd, Pm, Sm, Eu, Gd, Tb, Dy, Ho, Er, Tm, Yb, and Lu, or the like.

Oxide semiconductors according to example embodiments may be used, for example, as a channel material for driving transistors used in liquid crystal displays (LCDs), organic light emitting diodes (OLEDs), and the like. Oxide semiconductors according to example embodiments may also be used as a channel material for transistors included in peripheral circuits of memory devices or as a channel material for selection transistors.

Figure 1B:
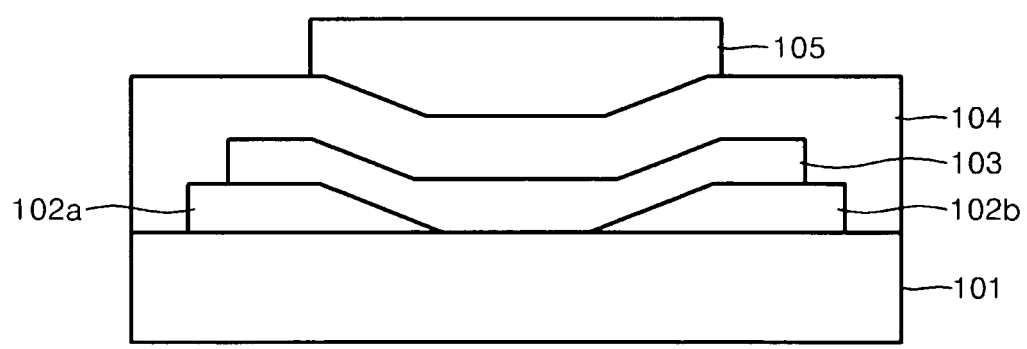

FIGS. 1A and 1B show cross-sectional views of thin film transistors including oxide semiconductors according to example embodiments. An example bottom gate type thin film transistor is shown in FIG. 1A, whereas an example top gate type thin film transistor is shown in FIG. 1B.

Referring to FIG. 1A, an oxide TFT according to an example embodiment may include a gate electrode 13 disposed on a portion of a substrate 11. A gate insulating layer 14 may be disposed on the substrate 11 and the gate electrode 13. When the substrate 11 is a silicon (Si) substrate, an oxide layer 12 may be formed on a surface of the substrate 11 using a thermal oxidation or similar process. A channel 15 may be formed on a portion of the gate insulating layer 14 corresponding to the gate electrode 13. A source 16a and a drain 16b may be disposed on respective sides of the channel 15 and on the gate insulating layer 14. In the oxide TFT according to at least this example embodiment, the channel 15 may include a Zn oxide or an In—Zn composite oxide to which Ta and/or Y may be added.

In one example, the gate electrode 13 may be formed to have a top surface and two sloping side surfaces (e.g., a trapezoid shaped cross-section, wherein the width of the upper surface is less than the width of the lower surface). The gate insulating layer 14 may be formed to cover upper and side surfaces of the gate electrode 13 and the exposed portion of the upper surface of the oxide layer 12. Although not shown, the oxide layer 12 may be omitted. The width of the channel 15 may correspond (e.g., be the same or substantially the same as) the width of the lower surface of the gate electrode 13.

Referring to FIG. 1B, in another example embodiment, the oxide TFT may include a source 102a and a drain 102b formed on a substrate 101. The source 102a and the drain 102b may be spaced apart from one another. A channel 103 may be formed between the source 102a and the drain 102b. The channel 103 may contact each of the source 102a and the drain 102b. A gate insulating layer 104 may be formed on the channel 103 and the substrate 101. A gate electrode 105 may be formed on the gate insulating layer 104. The gate electrode 105 may be formed on a portion of the gate insulating layer 104 corresponding to the channel 103. The gate electrode 105 may have a cross-sectional width less than that of the channel 103. When the substrate 101 is a silicon (Si) substrate, an oxide layer may be formed on a surface of the substrate 101 using a thermal oxidation or similar process.

Materials used to form the above-described layers of the oxide TFT according to at least this example embodiment shown in FIGS. 1A and/or 1B will now be described. The substrates 11 and 101 may be substrates used in semiconductor devices. For example, the substrates 11 and 101 may be formed of Si, glass, an organic or similar material. The oxide layers (e.g., 12 in FIG. 1A, but not shown in FIG. 1B) may be, for example, a $SiO_2$ layer formed by thermally oxidizing the substrates 11 and 101 if the substrates 11 and 101 are formed of Si. The gate electrodes 13 and 105 may be formed of a conductive material, for example, a metal such as Ti, Pt, Ru, Au, Ag, Mo, Al, W, Cu or the like, or a conductive metal oxide such as IZO (InZnO), AZO (AlZnO), or the like. The gate insulating layers 14 and 104 may be formed of an insulating material used in semiconductor devices. For example, the gate insulating layers 14 and 104 may be formed of, for example, $SiO_2$, a high-k material having a dielectric constant higher than $SiO_2$ (e.g., $HfO_2$, $Al_2O_3$, $Si_3N_4$, a mixture thereof or the like). Each of the sources 16a and 102a and the drains 16b and 102b may be formed of a conductive material, for example, a metal such as Ti, Pt, Ru, Au, Ag, Mo, Al, W, Cu or the like, or a conductive metal oxide such as IZO (InZnO), AZO (AlZnO) or the like.

Hereinafter, a method of manufacturing an oxide TFT according to an example embodiment will be described with reference to FIGS. 2A through 2E. The example embodiment of a method of manufacturing will be described with regard to the bottom gate type TFT shown in FIG. 1A. However, it will be understood that a similar process may be used to manufacture a top gate type TFT.

Figure 2A:
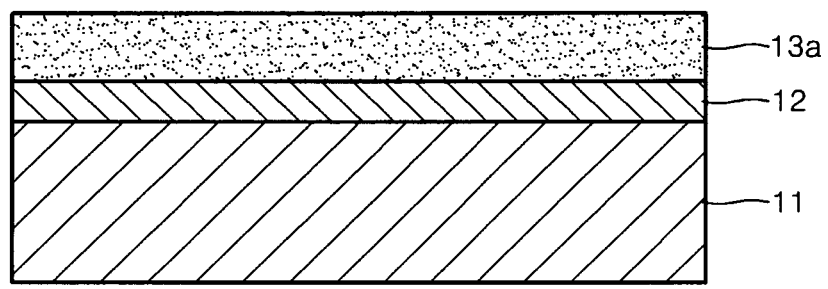
FIGS. 2A to 2E show a method of manufacturing an oxide thin film transistor according to an example embodiment.

Referring to FIG. 2A, a substrate 11 may be prepared. The substrate 11 may be formed of Si, glass, an organic or similar material. If the substrate 11 is formed of Si, an oxide layer 12 (e.g., $SiO_2$) may be formed on a surface of the substrate 11 using a thermal oxidation or similar process. A conductive material 13a, such as a metal or conductive metal oxide, may be coated on the substrate 11.

Figure 2B:
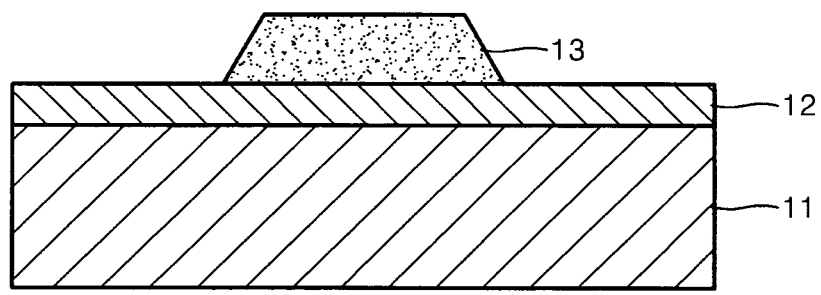

Referring to FIG. 2B, the conductive material 13a may be patterned to form a gate 13.

Figure 2C:
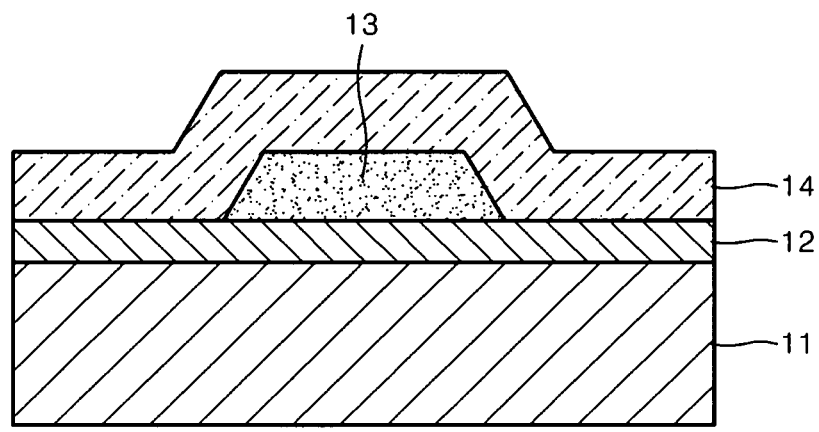

Referring to FIG. 2C, an insulating material may be coated on the gate 13 and patterned to form a gate insulating layer 14. The gate insulating layer 14 may be formed of, for example, a silicon oxide, a silicon nitride, a Hf oxide, an aluminum oxide, a mixture of a Hf oxide and an aluminum oxide or similar material.

Figure 2D:
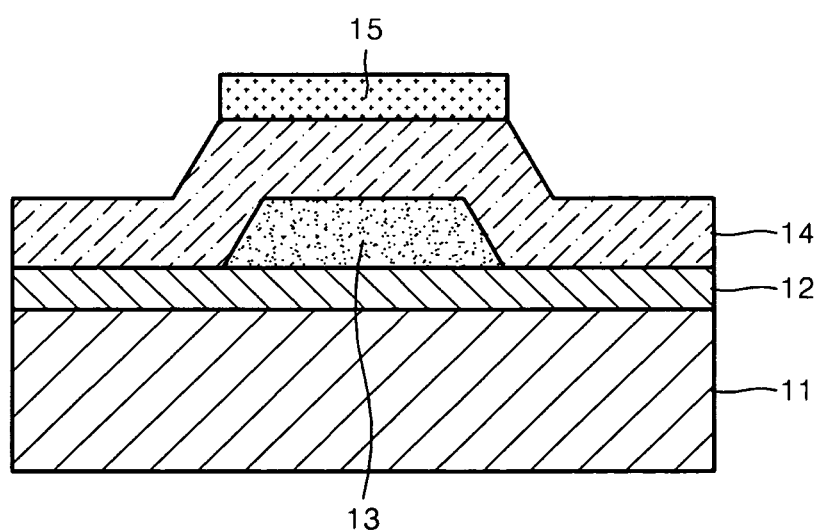

Referring to FIG. 2D, a channel material may be coated on the gate insulating layer 14 using a process such as physical vapor deposition (PVD), chemical vapor deposition (CVD), atomic layer deposition (ALD), or the like. The channel material may be patterned to form a channel 15 on a portion of the gate insulating layer 14 corresponding to the gate 13. The channel 15 may be formed by adding at least one of Ta and Y to a Zn material such as Zn oxide or a Zn—In composite oxide. For example, when the channel 15 is formed using sputtering, a ZnO or an IZO (InZnO) target and a Ta and/or Y target may be loaded in a process chamber and co-sputtered. Alternatively, a single ZnO target or InZnO target including at least one of Ta and Y may be used.

Figure 2E:
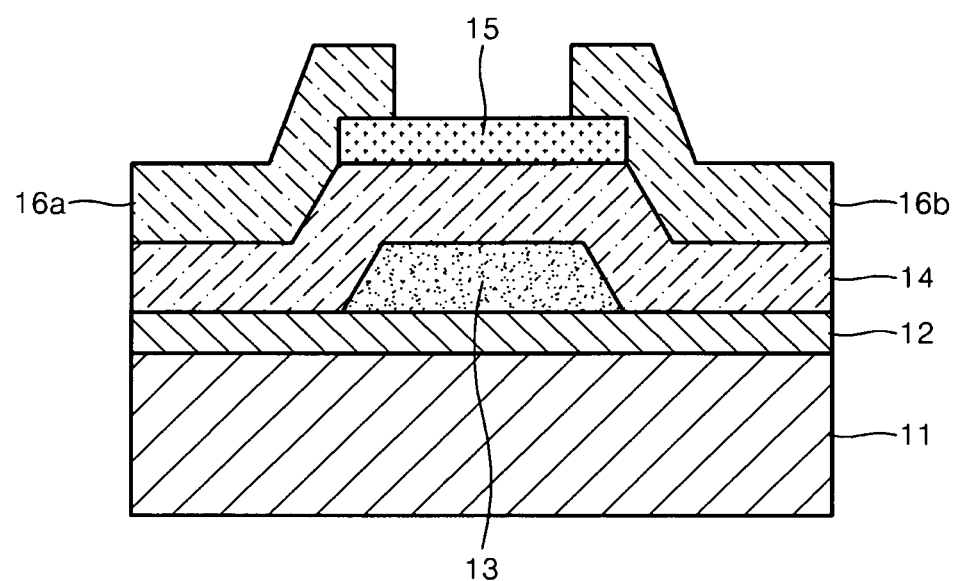
Figure 3A:
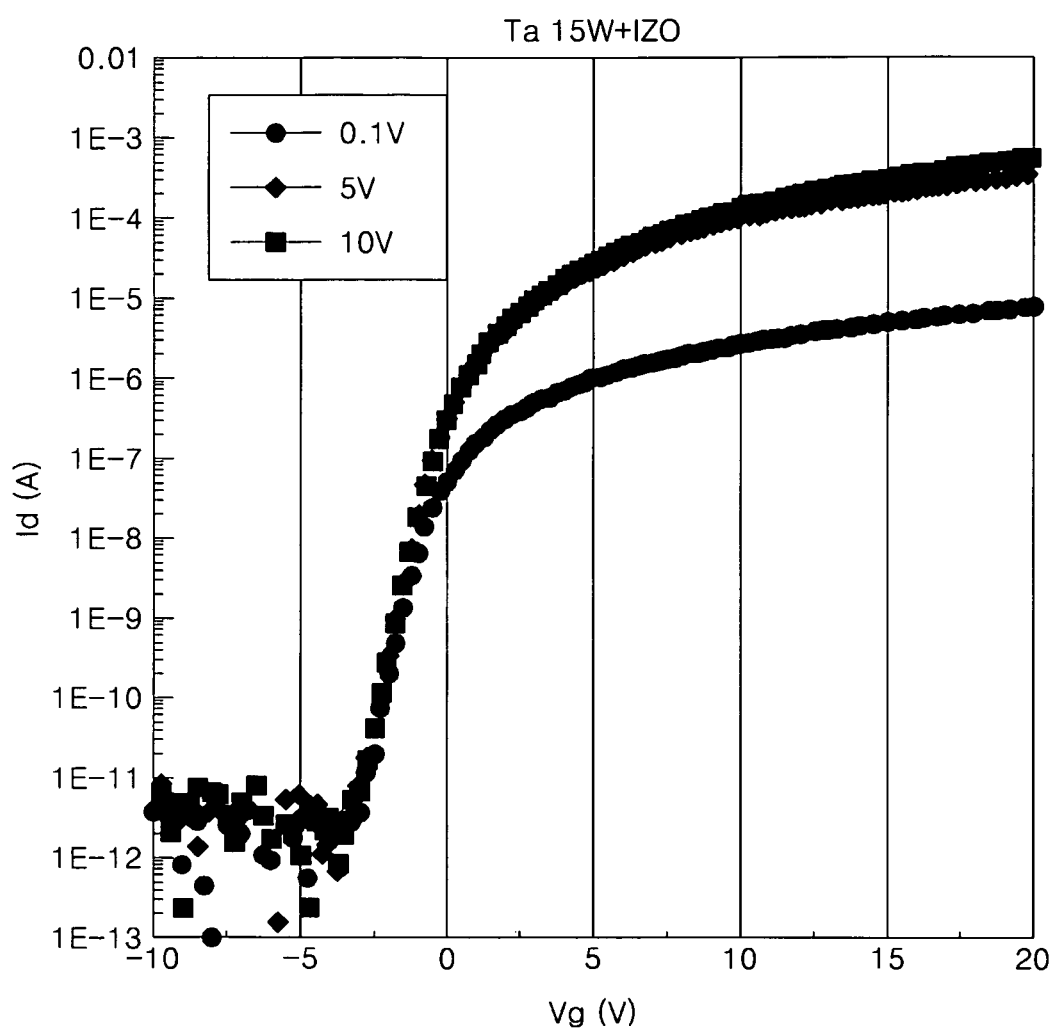
FIGS. 3A to 3F show graphs of drain current $I_d$ against gate voltage $V_g$ of an example embodiment of an oxide thin film transistor including an IZO including Ta as a channel material when various source-drain voltages (0.1V, 5V, and 10V) are applied to the oxide thin film transistor.
Figure 3B:
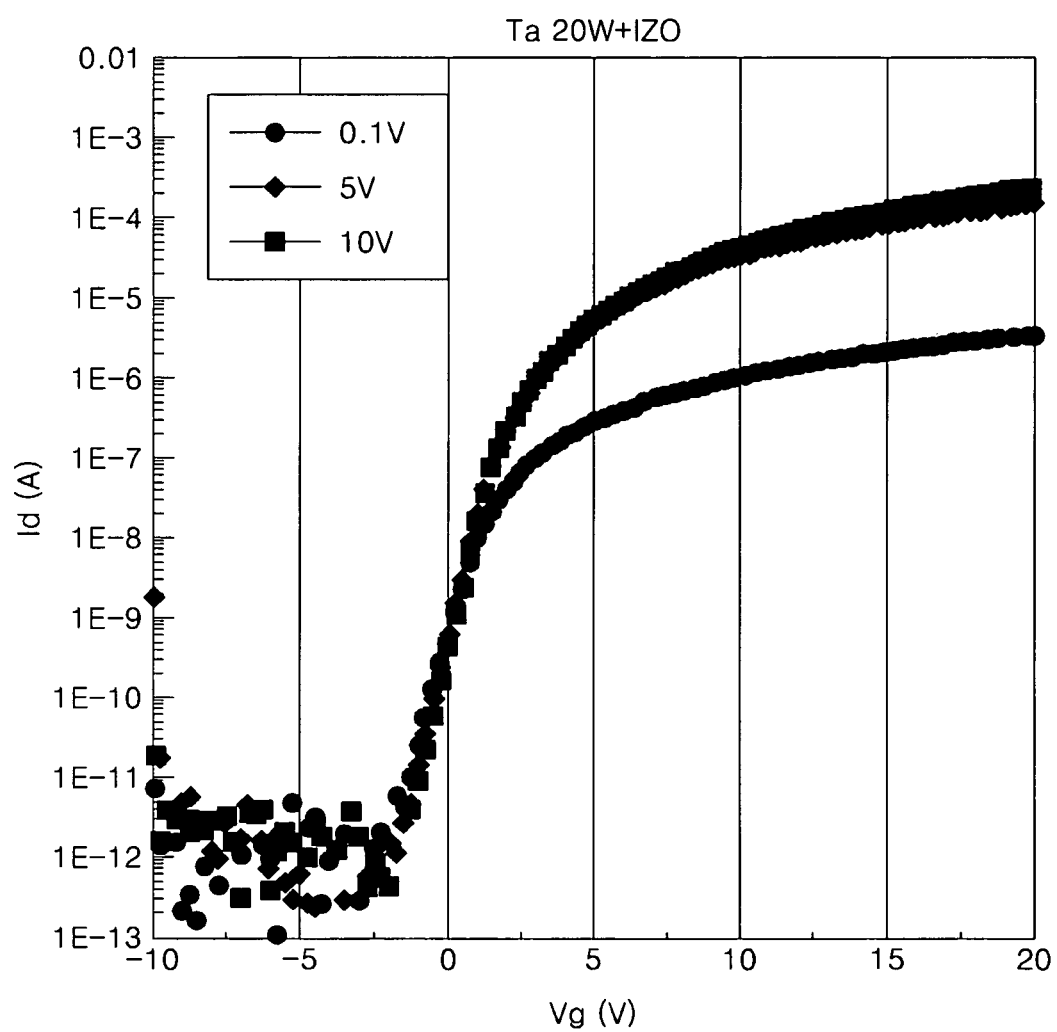
Figure 3C:
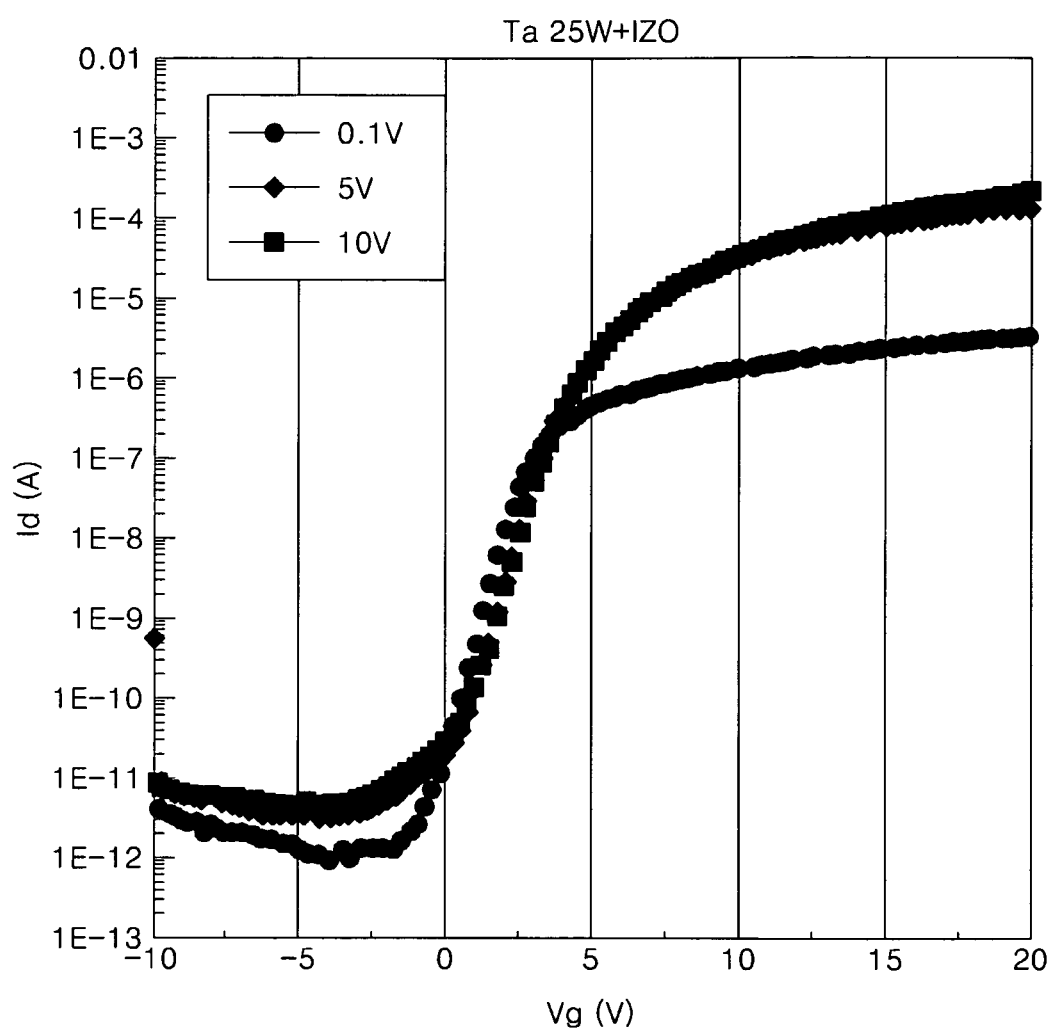
Figure 3D:
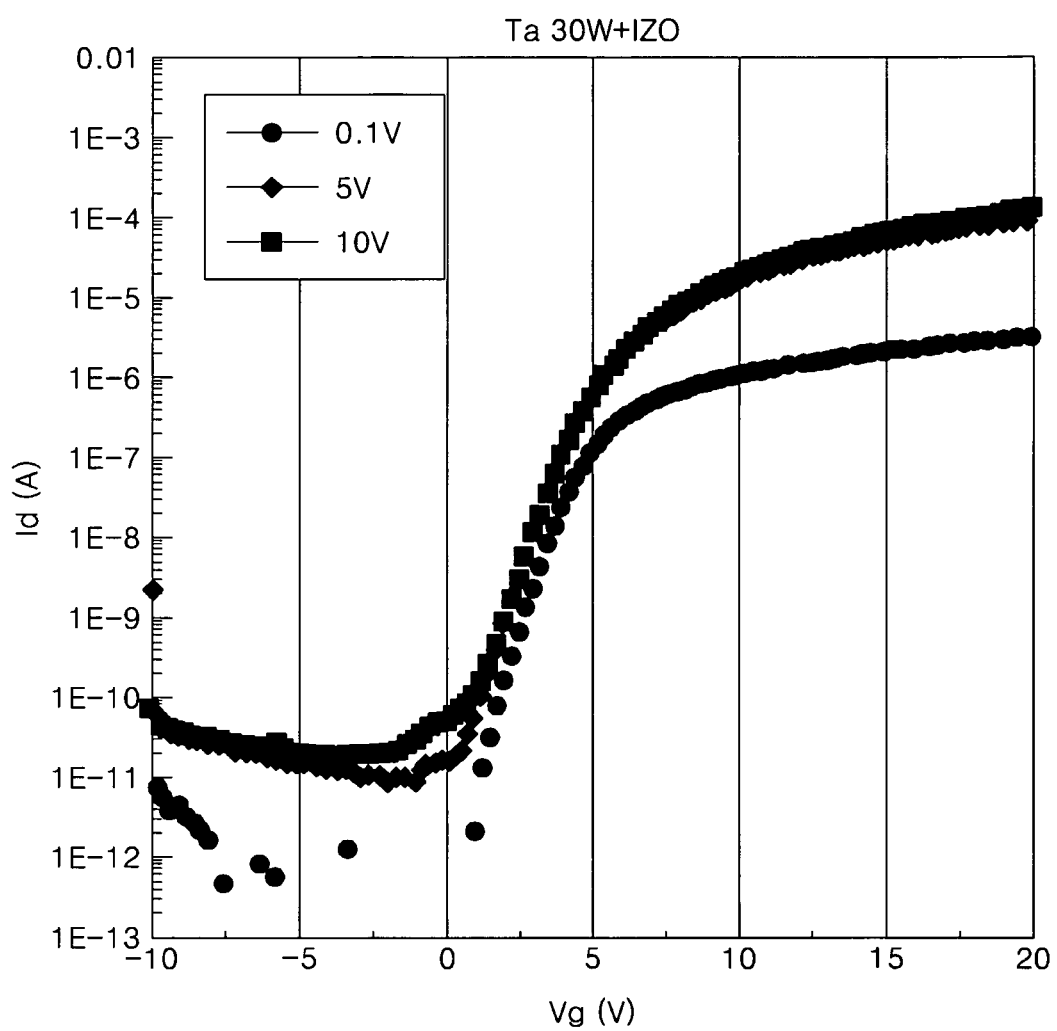
Figure 3E:
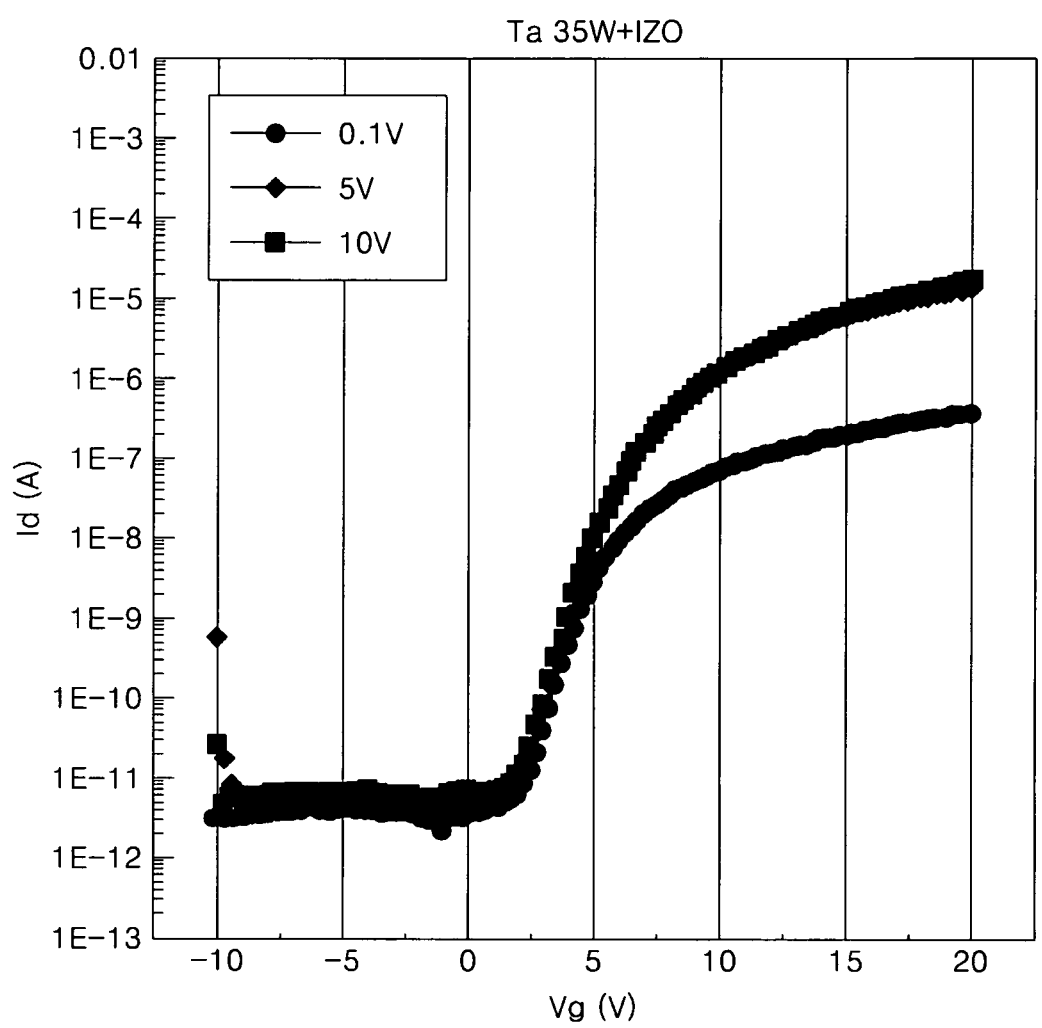
Figure 3F:
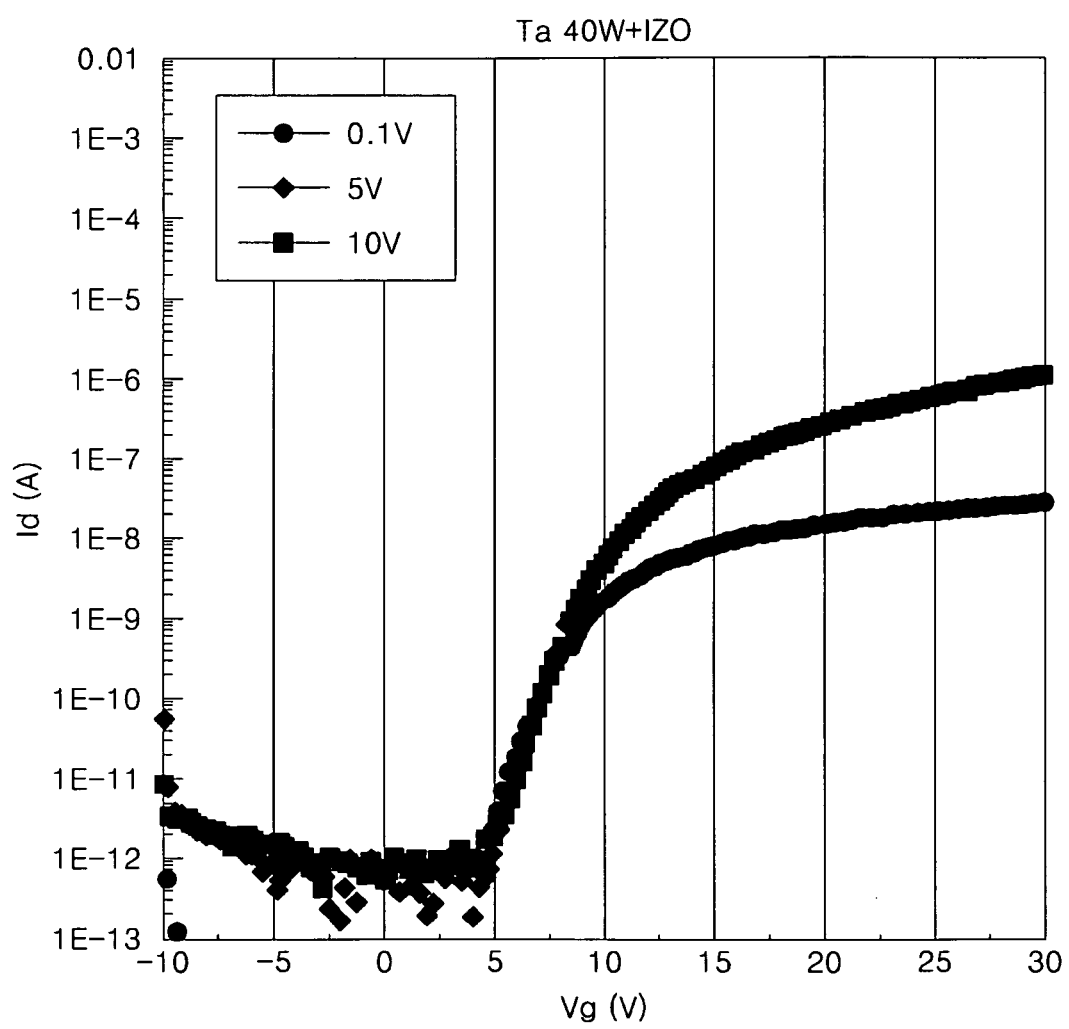

Referring to FIG. 2E, a conductive material such as a metal or conductive metal oxide, may be coated on the channel 15 and the gate insulating layer 14. The conductive material may be patterned so that the material connects to each end of the channel 15 to form a source 16a and a drain 16b. The resultant structure may be annealed at about 400° C. or less (e.g., at about 300° C.) using a general furnace, rapid thermal annealing (RTA), laser, a hot plate or the like.

PREPARATION EXAMPLE

A preparation example according to an example embodiment will now be described. The preparation example will be described with regard to FIG. 1A.

According to at least one example embodiment, Mo may be deposited on a silicon substrate 11 on which an oxide layer 12 is formed. The deposited Mo may form a gate electrode 13 having a thickness of about 200 nm. Silicon nitride may be coated on the substrate 11 and the gate electrode 13 to form a gate insulating layer 14 having a thickness of about 200 nm.

An oxide semiconductor may be coated on the gate insulating layer 14 to form a channel 15. The oxide semiconductor may be coated on a portion of the gate insulating layer 14 corresponding to the gate electrode 13. A process of forming the channel 15 will be described in more detail below.

In one example process of forming the channel 15, an IZO target (e.g., $In_2O_3$:ZnO=1:2 mol %) and a Ta or Y target may be used. These targets may be loaded in a chamber of a sputter. During deposition, the total pressure of a chamber may be maintained by supplying gaseous Ar and $O_2$ in a ratio of about 95:5, while RF power of about 150 W is applied to the IZO target, DC power of about 25-40 W, inclusive, is applied to the Ta target, and DC power of about 15-35 W, inclusive, is applied to the Y target. Using this process, the channel 15 may be formed to a thickness of about 70 nm. A ZnO target may be used instead of the InZnO target.

A Ti/Pt (e.g., about 10/100 nm) double layer may be formed on either side of the channel 15 as a source and a drain. The resultant structure may be thermally treated at a temperature between about 300° C. to about 350° C., inclusive, for about 1 hour. Impurities formed on the surface of the channel may be removed using, for example, an etching solution (e.g., water:acetic acid:hydrochloric acid=about 80:20:0.1 vol %).

Drain currents $I_d$ against gate voltages $V_g$ of the oxide thin film transistor (e.g., with channel size: W/L=50 μm/4 μm) prepared according to the above-described preparation example were measured when source-drain voltages of 0.1V and 10V were applied thereto.

FIGS. 3A to 3F show graphs of drain current $I_d$ versus gate voltage $V_g$ of an oxide thin film transistor according to an example embodiment. In this example, the oxide thin film transistor includes an IZO including Ta as a channel material. The data shown in FIGS. 3A to 3F are obtained when various source-drain voltages (e.g., 0.1V, 5V, and 10V) are applied to the oxide thin film transistor.

FIGS. 3A to 3F show graphs of a sample including a channel formed by respectively supplying various powers (e.g., 15 W, 20 W, 25 W, 30 W, 35 W, and 40 W) to the deposition of the Ta target during the sputtering process.

Referring to FIGS. 3A to 3F, the channel material has transfer curve properties available for a transistor in the entire range of the power supplied to the deposition. Table 1 below shows composition, mobility, and swing voltage according to the intensity of power supplied to the deposition of the Ta target. To evaluate composition of the oxide semiconductor materials, Inductively Coupled Plasma (ICP)-Auger Electron Spectroscopy (AES) analysis (having an error range of about 1%) was performed using a sequential spectrometer. Referring to Table 1, as the power for the deposition of the Ta target increases, the amount of Ta increases. The at % ratio of Ta:In:Zn shown in Table 1 was in the range of about 1:2.1 to 9.5:1.6 to 6.4, inclusive. In this experimental example, an On current was about $10^{-4}$ A, an Off current was less than or equal to about $10^{-11}$-$10^{-12}$ A, inclusive. An On/Off current ratio was greater than or equal to about $10^7$ when at % ratio of Ta:In:Zn was in the range of about 1:5.7 to 9.5:4.8 to 6.4 which corresponds to Ta of about 15-25 W, inclusive.

TABLE 1

| Ta deposition power | Ta 15 W | Ta 20 W | Ta 25 W | Ta 30 W | Ta 35 W | Ta 40 W |
|---|---|---|---|---|---|---|
| Atomic ratio (Ta:In:Zn) | 1:9.5:6.4 | 1:7.7:5.8 | 1:5.7:4.8 | 1:3.6:3.2 | 1:2.7:2.2 | 1:2.1:1.6 |
| Mobility ($cm^2$/Vs) | 9.4 | 7.5 | 5.2 | 2.77 | 0.862 | 0.022 |
| Swing voltage (V/dec) | 0.267 | 0.257 | 0.287 | 0.283 | 0.398 | 0.405 |

Figure 4A:
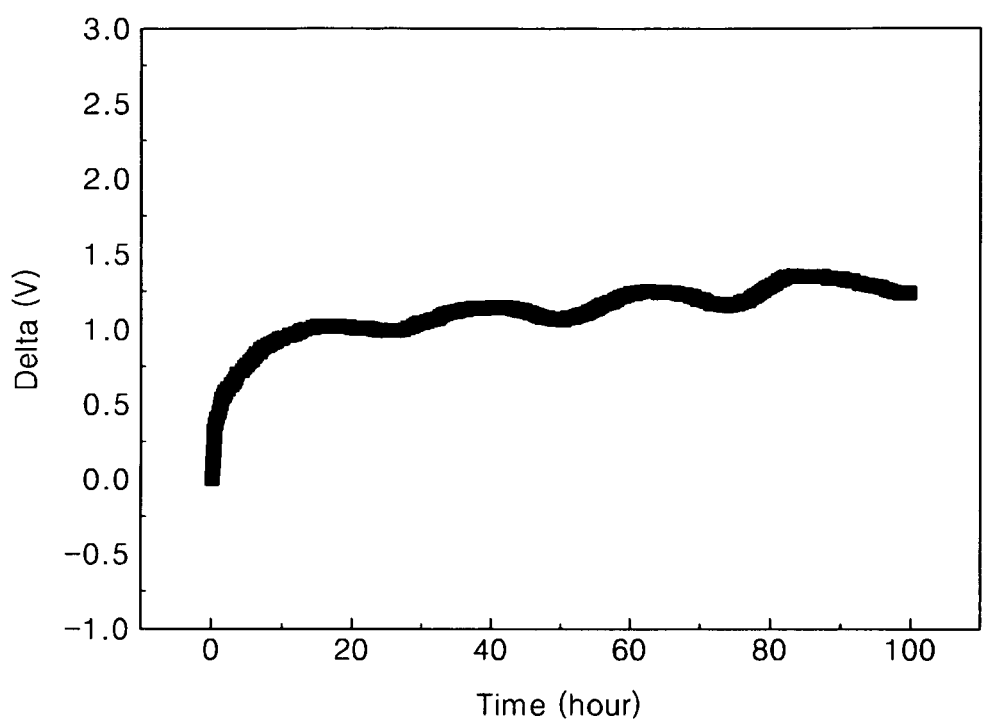
FIGS. 4A and 4B are graphs showing changes in gate voltage ($\Delta V$) over time of a sample of an example embodiment of an oxide thin film transistor, including a channel formed by supplying a power of 25 W to deposition of a Ta target and thermally treating the channel at 350° C., in response to a drain current of 3 µA at 50° C.
Figure 4B:
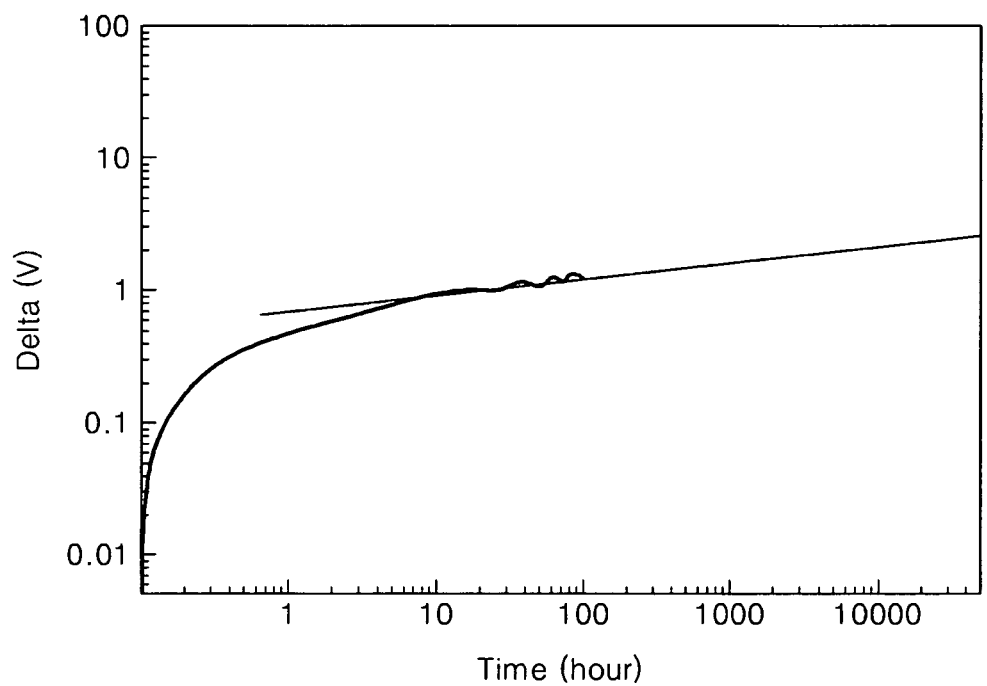

FIGS. 4A and 4B show graphs of changes of gate voltage when a drain current is 3 μA of a sample of an oxide thin film transistor according to an example embodiment. In this example, the oxide thin film transistor includes a channel formed by supplying a power of 25 W to deposition of a Ta target and thermally treating the channel at about 350° C. The changes of gate voltage were measured at about 50° C.

Referring to FIG. 4A, the changes in gate voltage increase (e.g., slightly increase) over time. Referring to FIG. 4B, the changes of the gate voltage are estimated to be about 2.5 V after about 50,000 hours. Thus, the variation on initial electrical characteristics is relatively (e.g., very) low in semiconductor thin film transistors according to example embodiments. As a result, oxide TFTs according to example embodiments exhibit a relatively high On/Off current ratio and a relatively low Off current, with little or no hysteresis.

Accordingly, oxide TFTs according to example embodiments show improved oxide TFT characteristics, relative to conventional oxide TFTs.

Figure 5A:
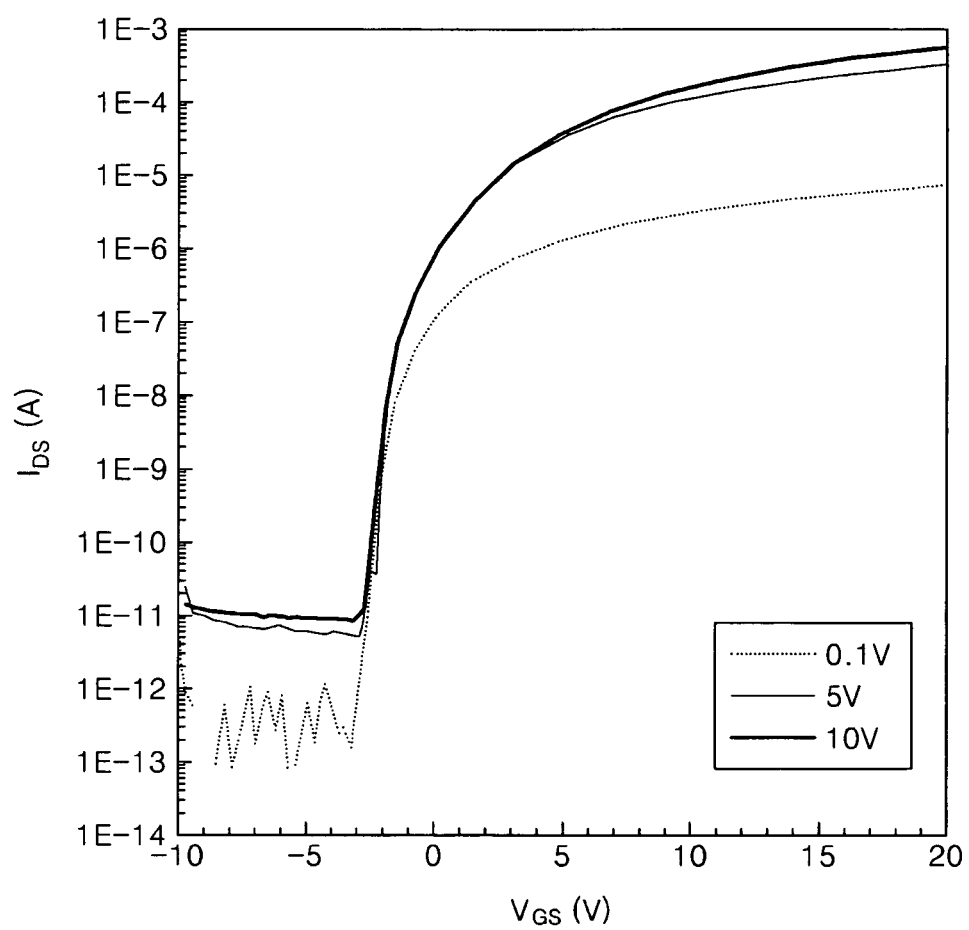
FIGS. 5A and 5B show graphs of drain current $I_{DS}$ versus gate voltage $V_{GS}$ of an example embodiment of an oxide thin film transistor including an IZO, wherein the IZO further includes Y, as a channel material when various source-drain voltages (0.1V, 5V, and 10V) are applied to the oxide thin film transistor.
Figure 5B:
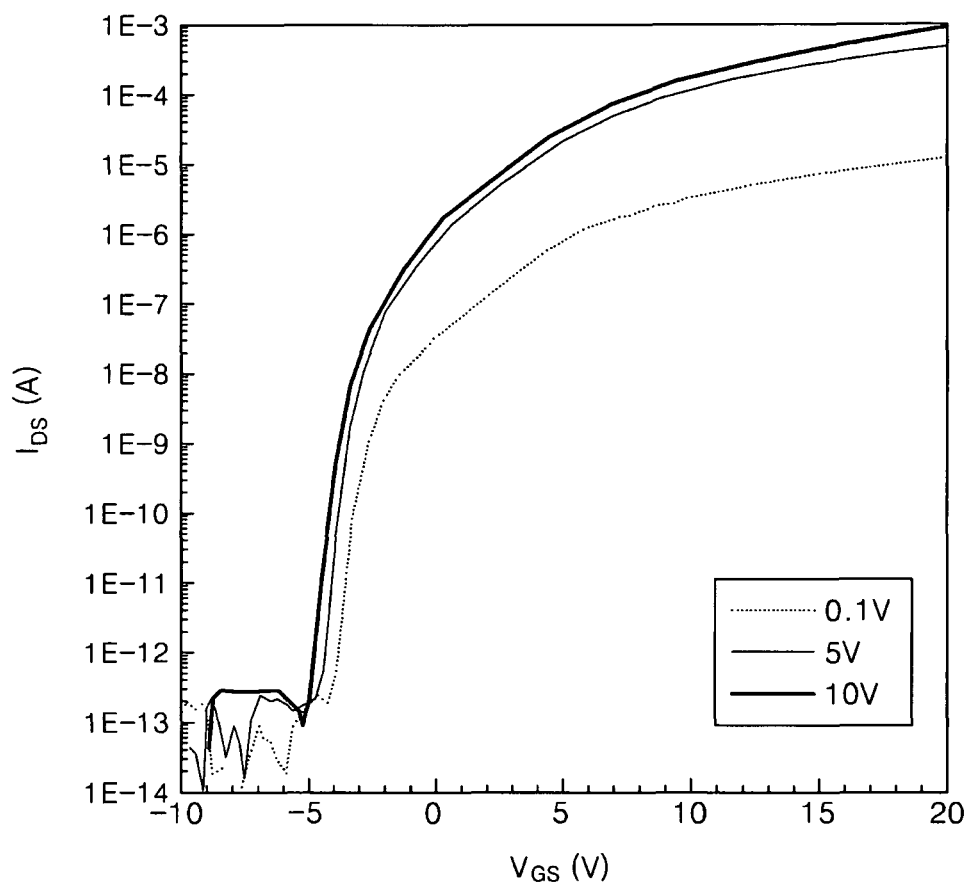

FIGS. 5A and 5B show graphs of drain current $I_{DS}$ versus gate voltage $V_{GS}$ of an example embodiment of an oxide thin film transistor when various source-drain voltages (0.1V, 5V, and 10V) are applied to the oxide thin film transistor. In this example, the oxide thin film transistor includes an IZO including Y as a channel material.

FIGS. 5A and 5B show graphs of a sample including a channel formed by supplying a power of about 15 W to deposition of the Y target and powers of about 150 W and about 200 W to the deposition of the IZO target during the sputtering process.

Referring to FIGS. 5A and 5B, as shown the channel material has transfer curve properties suitable for a transistor. Table 2 shows atomic ratios of Y:In:Zn according to the power supplied to the deposition of the Y target. To evaluate composition of the oxide semiconductor materials, ICP-AES analysis (having an error range of about 1%) was performed using a sequential spectrometer. Referring to Table 2, as the power for the deposition of the Y target increases, the amount of Y increases. The at % ratio of Y:In:Zn shown in Table 2 was in the range of about 1:21.7 to 50:14 to 41, inclusive. In this example, an On current was about $10^{-4}$ A, an Off current was less than or equal to about $10^{-11}$-$10^{-12}$ A, and an On/Off current ratio was greater than or equal to about $10^7$ when at % ratio of Y:In:Zn was in the range of about 1:46 to 50:30 to 41, inclusive.

TABLE 2

| Y deposition power | Y15 W (IZO 200 W) | Y15 W (IZO 150 W) | Y25 W (IZO 150 W) | Y35 W (IZO 150 W) |
|---|---|---|---|---|
| Atomic ratio (Y:In:Zn) | 1:50:41 | 1:46:30 | 1:30:22 | 1:21.7:14 |

Figure 5C:
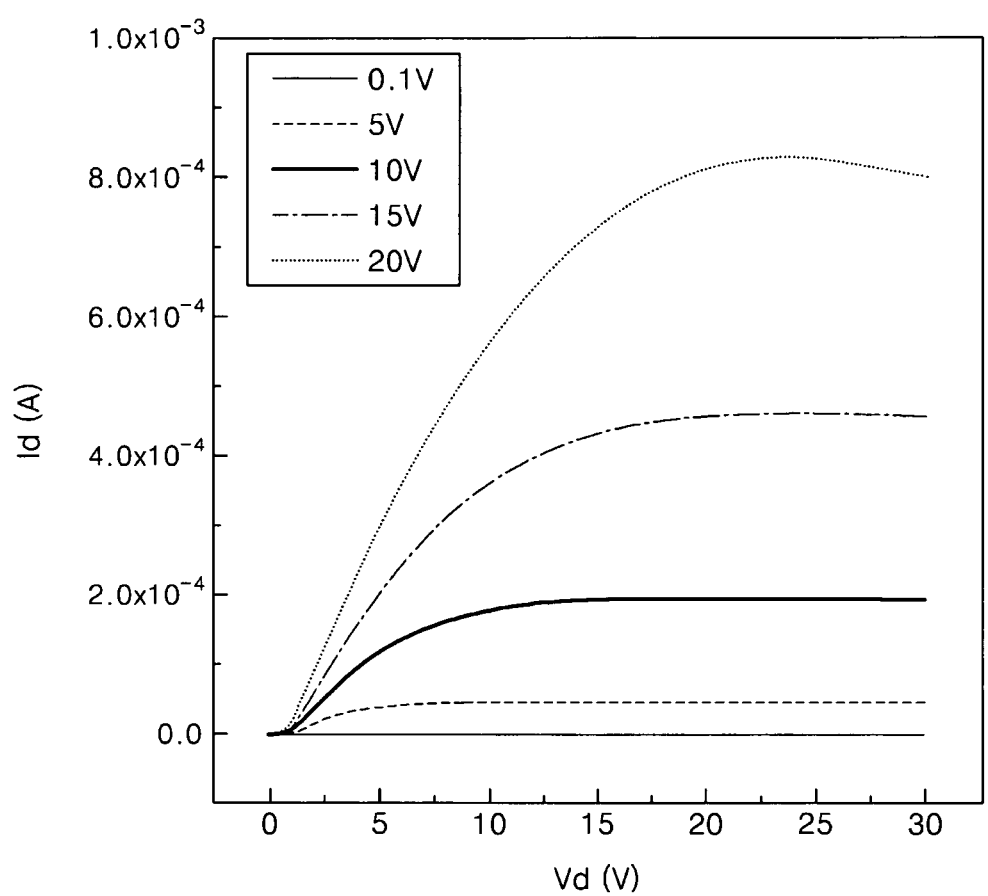
FIG. 5C shows a graph of drain current $I_d$ versus drain voltage $V_d$ of an example embodiment of an oxide thin film transistor including a channel formed by supplying a power of 15 W to deposition of a Y target when various gate voltages (0.1, 5, 10, 15, and 20 V) are applied to the oxide thin film transistor.

FIG. 5C shows a graph of drain current $I_d$ versus drain voltage $V_d$ of an example embodiment of an oxide thin film transistor. In this example, the oxide thin film transistor includes a channel formed by supplying a power of 15 W to deposition of a Y target when various gate voltages (e.g., 0.1, 5, 10, 15, and 20 V) are applied to the oxide thin film transistor. An IZO (e.g., $In_2O_3$:ZnO=1:2 mol %) target was co-sputtered by applying RF 150 W to the IZO target. Referring to FIG. 5C, when a drain voltage is about 0.1 V, the drain current remains constant or substantially constant despite an increase in drain voltage. However, when the drain voltage is about 5 V or greater, the drain current increases as the drain voltage increases.

Figure 6A:
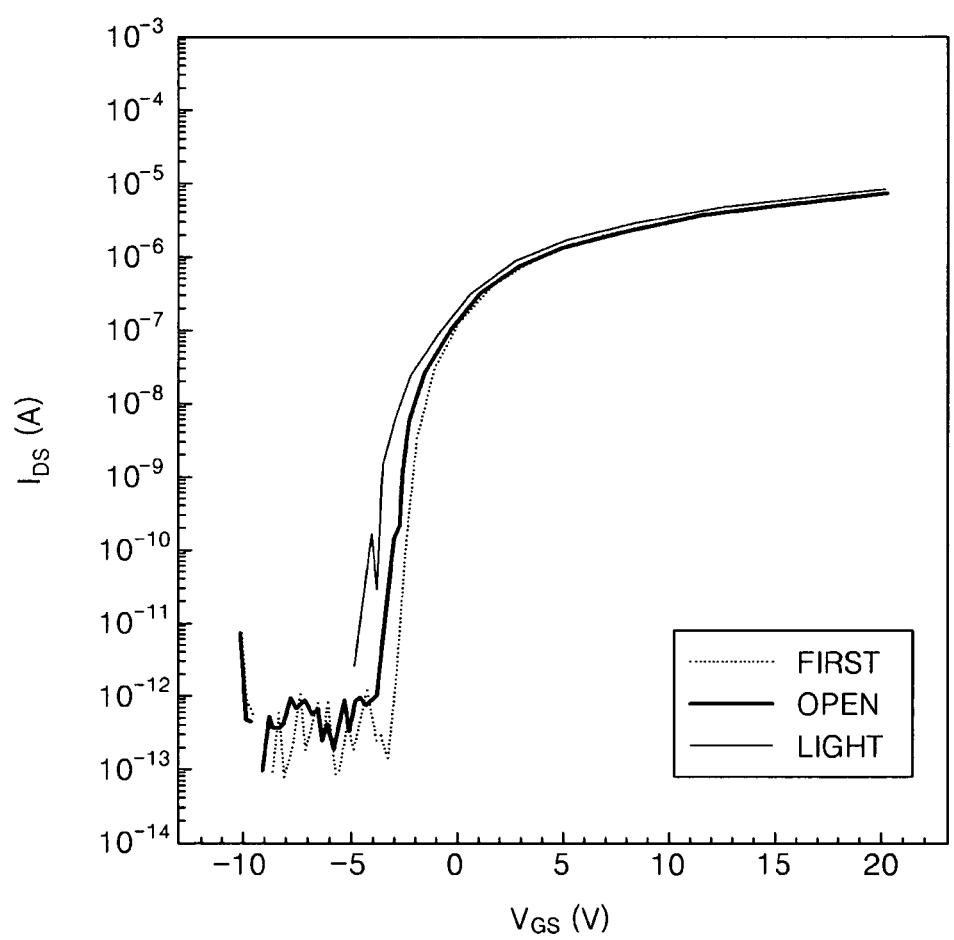
FIGS. 6A and 6B show graphs of drain current $I_{DS}$ against gate voltage $V_{GS}$ of an example embodiment of an oxide thin film transistor including a channel formed by supplying a power of 15 W to deposition of a Y target in order to measure changes of electrical characteristics of the oxide thin film transistor when the oxide thin film transistor is exposed to light.
Figure 6B:
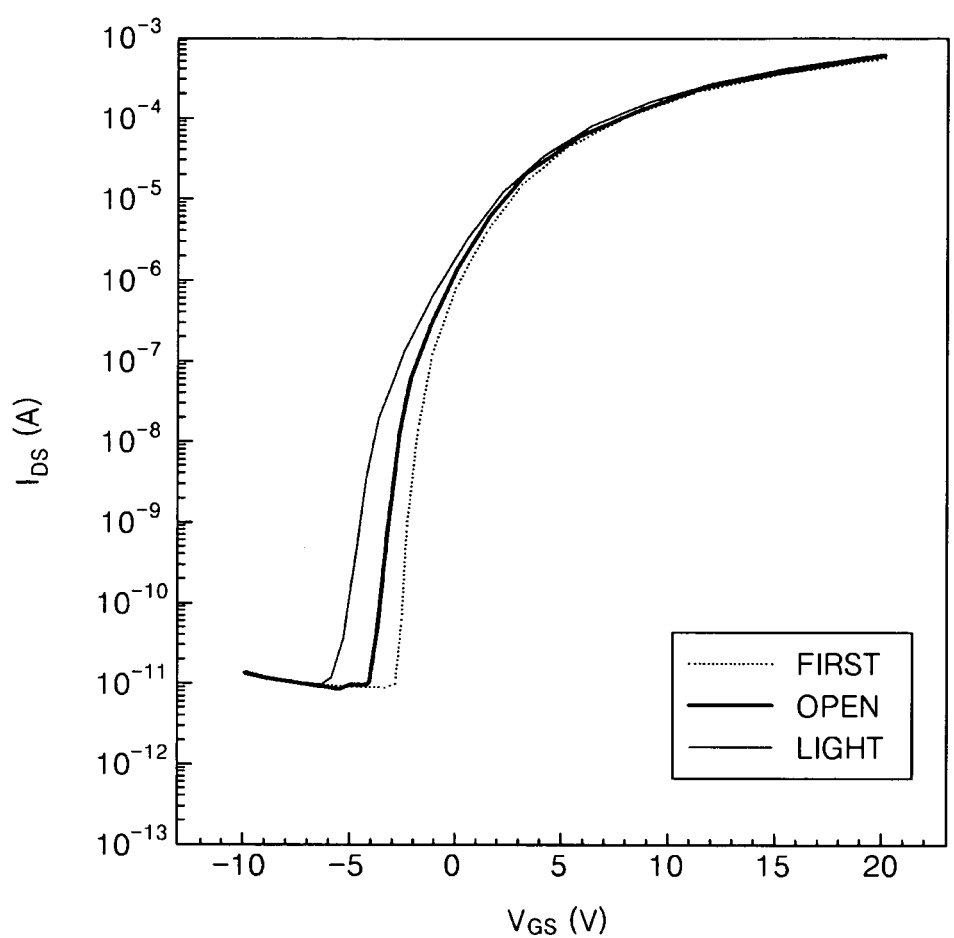

FIGS. 6A and 6B show graphs of drain current $I_{DS}$ versus gate voltage $V_{GS}$ of an oxide thin film transistor according to an example embodiment. In this example, the oxide thin film transistor includes a channel formed by supplying a power of 15 W to deposition of a Y target to measure changes in electrical characteristics of the oxide thin film transistor when the oxide thin film transistor is exposed to light. An IZO (e.g., $In_2O_3$:ZnO=1:2 mol %) target was co-sputtered by applying RF power of 150 W to the IZO target. FIG. 6A shows a graph of drain current $I_{DS}$ versus gate voltage $V_{GS}$ when a source-drain voltage is about 0.1 V, and FIG. 6B shows a graph of drain current $I_{DS}$ versus gate voltage $V_{GS}$ when a source-drain voltage is about 10 V.

In FIGS. 6A and 6B, "First" indicates drain current $I_{DS}$ against gate voltage $V_{GS}$ after (e.g., immediately after) a sample is formed, "Open" indicates drain current $I_{DS}$ against gate voltage $V_{GS}$ when the sample is exposed to natural light (e.g., door open), and "Light" indicates drain current $I_{DS}$ against gate voltage $V_{GS}$ when the thin film transistor is exposed (e.g., directly exposed) to light from a lamp.

Referring to FIGS. 6A and 6B, there is little variation between the transfer curves in the three example cases. Accordingly, thin film transistors according example embodiments are not largely affected by external environment, for example, light, and may have improved (e.g., excellent) reliability.

Meanwhile, the composition of the deposited thin film, $I_{DS}$-$V_{GS}$ graph, and mobility properties may vary according to the type of target, voltage applied to the target, deposition equipment, deposition pressure, oxygen partial pressure, temperature of substrate, or the like. For example, when a single target of InZnO including Ta and/or Y is used instead of using both an InZnO target and a Ta, or an InZnO target and a Y target, the composition of the deposited thin film may change. Furthermore, when the composition of the deposited thin film is the same or substantially the same, properties of the thin film may change. For example, when the oxide semiconductor is deposited using sputtering, the resistance range may change according to oxygen partial pressure. If the oxygen partial pressure is controlled to be less than a certain level, the deposited thin film may have a relatively low resistance. If the oxygen partial pressure is controlled to be greater than a certain level, the deposited thin film may have a relatively high resistance.

It will be understood by those of ordinary skill in the art that an oxide semiconductor according to example embodiments may be applied to various electronic devices such as driving transistors of flat panel displays such as LCDs, OLEDs or the like, and transistors included in peripheral circuits of memory devices or the like. Oxide thin film transistors according to example embodiments may be a bottom gate-type or top gate-type transistors.

According to example embodiments, the ranges of values set forth herein are meant to be inclusive, whether or not explicitly indicated as such. Consequently, ranges of values designated as, for example, about 2.1 to 18 may include values equal or substantially equal to 2.1 and values equal or substantially equal to 18 in addition to the values between 2.1 and 18.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An oxide semiconductor comprising Zn and Ta, wherein the oxide semiconductor is amorphous, wherein the Zn is a Zn—In composite oxide including Ta, and wherein an at % ratio of Ta:In:Zn is in the range of about 1:2.1 to 18:1.6 to 14, inclusive.

2. The oxide semiconductor of claim 1, wherein an at % ratio of Ta:In:Zn is in the range of about 1:2.1 to 9.5:1.6 to 6.4, inclusive.

3. The oxide semiconductor of claim 1, wherein an at % ratio of Ta:In:Zn is in the range of about 1:5.7 to 9.5:4.8 to 6.4, inclusive.

4. The oxide semiconductor of claim 1, further comprising:
at least one element selected from the group consisting of Groups I, II, III, IV, and V elements and elements belonging to the lanthanide series.

5. An oxide thin film transistor comprising:
a gate;

a channel formed to correspond to the gate, the channel comprising the oxide semiconductor of claim 1;

a gate insulating layer formed between the gate and the channel; and a source and a drain contacting respective sides of the channel.

6. The oxide thin film transistor of claim 5, wherein the oxide semiconductor has an at % ratio of Ta:In:Zn in the range of about 1:2.1 to 9.5:1.6 to 6.4, inclusive.

7. The oxide thin film transistor of claim 5, wherein the oxide semiconductor has an at % ratio of Ta:In:Zn in the range of about 1:5.7 to 9.5:4.8 to 6.4, inclusive.

8. The oxide thin film transistor of claim 5, wherein the oxide semiconductor further includes,
at least one element selected from the group consisting of Groups I, II, III, IV, and V elements and elements belonging to the lanthanide series.

9. The oxide semiconductor of claim 1, wherein the Ta is ionically bonded to oxygen of the Zn—In composite oxide.

10. The oxide semiconductor of claim 1, wherein the Ta is substituted for a portion of the Zn in the Zn—In composite oxide.

11. The oxide semiconductor of claim 1, wherein the oxide semiconductor is an amorphous oxide semiconductor channel region.

12. An oxide semiconductor comprising Zn and Y, wherein the Zn is a Zn—In composite oxide, and wherein an atomic % ratio of Y:In:Zn is in the range of about 1:10 to 100:10 to 80, inclusive.

13. The oxide semiconductor of claim 12, wherein an at % ratio of Y:In:Zn is in the range of about 1:21.7 to 50:14 to 41, inclusive.

14. The oxide semiconductor of claim 13, wherein an at % ratio of Y:In:Zn is in the range of about 1:46 to 50:30 to 41, inclusive.

15. The oxide semiconductor of claim 12, further comprising:
at least one element selected from the group consisting of Groups I, II, III, IV, and V elements and elements belonging to the lanthanide series.

16. An oxide thin film transistor comprising:
a gate;
a channel formed to correspond to the gate, the channel comprising the oxide semiconductor of claim 12;
a gate insulating layer formed between the gate and the channel; and
a source and a drain contacting respective sides of the channel.

17. The oxide thin film transistor of claim 16, wherein the oxide semiconductor has an at % ratio of Y:In:Zn in the range of about 1:21.7 to 50:14 to 41, inclusive.

18. The oxide thin film transistor of claim 16, wherein the oxide semiconductor has an at % ratio of Y:In:Zn in the range of about 1:4.6 to 50:30 to 41, inclusive.

19. The oxide thin film transistor of claim 16, wherein the oxide semiconductor further includes,
at least one element selected from the group consisting of Groups I, II, III, IV, and V elements and elements belonging to the lanthanide series.

20. An oxide semiconductor comprising Zn and at least one of Ta and Y, wherein the oxide semiconductor is amorphous, wherein the Zn is a Zn—In composite oxide, wherein an atomic % ratio of Ta:In:Zn is in the range of about 1:2.1 to 18:1.6 to 14, inclusive, and wherein an atomic % ratio of Y:In:Zn is in the range of about 1:10 to 100:10 to 80, inclusive.

21. An oxide thin film transistor comprising:
a gate;
a channel formed to correspond to the gate, the channel comprising the oxide semiconductor of claim 20;
a gate insulating layer formed between the gate and the channel; and
a source and a drain contacting respective sides of the channel.

22. The oxide semiconductor of claim 20, wherein the at least one of the Ta and Y is ionically bonded to oxygen of the Zn—In composite oxide.

23. The oxide semiconductor of claim 20, wherein the Ta or Y is substituted for a portion of the Zn in the Zn—In composite oxide.

24. The oxide semiconductor of claim 20, wherein the oxide semiconductor is an amorphous oxide semiconductor channel region.

* * * * *